United States Patent [19]

Kitamura et al.

[11] 4,366,397

[45] Dec. 28, 1982

[54] LEVEL CONVERSION CIRCUIT

[75] Inventors: Nobuaki Kitamura, Kodaira; Kouji Masuda, Ohme; Masao Mizukami, Yokohama, all of Japan

[73] Assignees: Hitachi, Ltd.; Hitachi Ome Electronic Co., Ltd., both of Tokyo, Japan

[21] Appl. No.: 157,936

[22] Filed: Jun. 9, 1980

[30] Foreign Application Priority Data

Jun. 29, 1979 [JP]  Japan .................................. 54-81350
Sep. 3, 1979 [JP]  Japan ............................... 54-111776

[51] Int. Cl.³ ......................................... H03K 19/092
[52] U.S. Cl. .................................... 307/264; 307/446; 307/475; 307/296 R
[58] Field of Search ............... 307/262, 264, 446, 455, 307/456, 448, 296 R, 475, 300

[56] References Cited

U.S. PATENT DOCUMENTS

| | | | |
|---|---|---|---|
| 3,590,274 | 6/1971 | Marley | 307/455 |
| 3,766,406 | 10/1973 | Bryant et al. | 307/475 |
| 4,249,091 | 2/1981 | Yamagiwa | 307/455 |

OTHER PUBLICATIONS

J. C. Froment et al., "ECL to TTL Translator Driver",
IBM Technical Disclosure Bulletin, vol. 21, No. 10, Mar. 1979, pp. 4074-4075.
Patents Abstracts of Japan, vol. 2, No. 104, 26.08.78, p. 5430e78.

*Primary Examiner*—John Zazworsky
*Attorney, Agent, or Firm*—Antonelli, Terry & Wands

[57] ABSTRACT

The collectors of differential pair transistors having their emitters connected to each other are connected to a positive power source voltage via respective load resistors. The emitters are connected to a negative power source voltage via a current source transistor.

The base bias voltage of the current source transistor is supplied from a bias circuit operating on the difference voltage between the positive power source voltage and the negative power source voltage.

When the positive power source voltage drops, the base bias voltage of the current source transistor drops in response thereto. Hence, the value of a current flowing through the current source transistor decreases. Due to this decrease of the current, the voltage drop of the load resistors decreases, thereby off-setting a low level potential of the collector output signals of the differential pair transistors.

Thus, the differential pair transistors are prevented from being driven into saturation.

6 Claims, 8 Drawing Figures

LEVEL CONVERSION CIRCUIT

BACKGROUND OF THE INVENTION

This invention relates to a level conversion circuit such as one used as the interface between the output of an ECL circuit and the input of a TTL circuit or an N-MOS circuit, for example.

Since the ECL (emitter coupled logic) circuit makes use of a negative power source voltage $V_{EE}$, the signal level of the ECL circuit varies between ground potential (GND) and the negative power source voltage $V_{EE}$. On the other hand, the TTL (transistor-transistor logic) circuit or the N-MOS (N channel insulated gate field effect transistor) circuit makes use of a positive power source voltage $V_{CC}$ and hence, the signal level of the TTL circuit or of the N-MOS circuit varies between the positive power source voltage $V_{CC}$ and ground potential (GND).

As the interface between the output of the first circuit operating on the negative power source voltage $V_{EE}$ and the input of the second circuit operating on the positive power source voltage $V_{CC}$, a signal level conversion circuit is necessary. In an $IC_1$ encompassed by the two-dot chain line in FIG. 1, a circuit indicated by $l_2$ is a heretofore known semiconductor integrated circuit, forming a signal level conversion circuit. A first power terminal of the ECL circuit $l_1$ is connected to the ground potential (GND) and a negative power source voltage $V_{EE}$ (e.g., $-5.2$ V) is impressed upon a second power terminal $P_2$. Accordingly, the signal level of an output signal $\bar{y}$ obtained from an output terminal $P_7$ of the ECL circuit $l_1$ varies between the ground potential (GND) and the negative power source voltage $V_{EE}$. A positive power source voltage $V_{CC}$ (e.g., $+5.0$ V) is impressed upon a first power terminal $P_{10}$ of the TTL circuit $l_3$ and its second power terminal $P_{16}$ is connected to the ground potential (GND). Hence, the signal level of the TTL circuit $l_3$ varies between the positive power source voltage $V_{CC}$ and ground potential (GND). The heretofore known level conversion circuit $l_2$ is disposed between the output terminal $P_7$ of the ECL circuit $l_1$ and the input terminal $P_{15}$ of the TTL circuit $l_3$.

Figure 1:
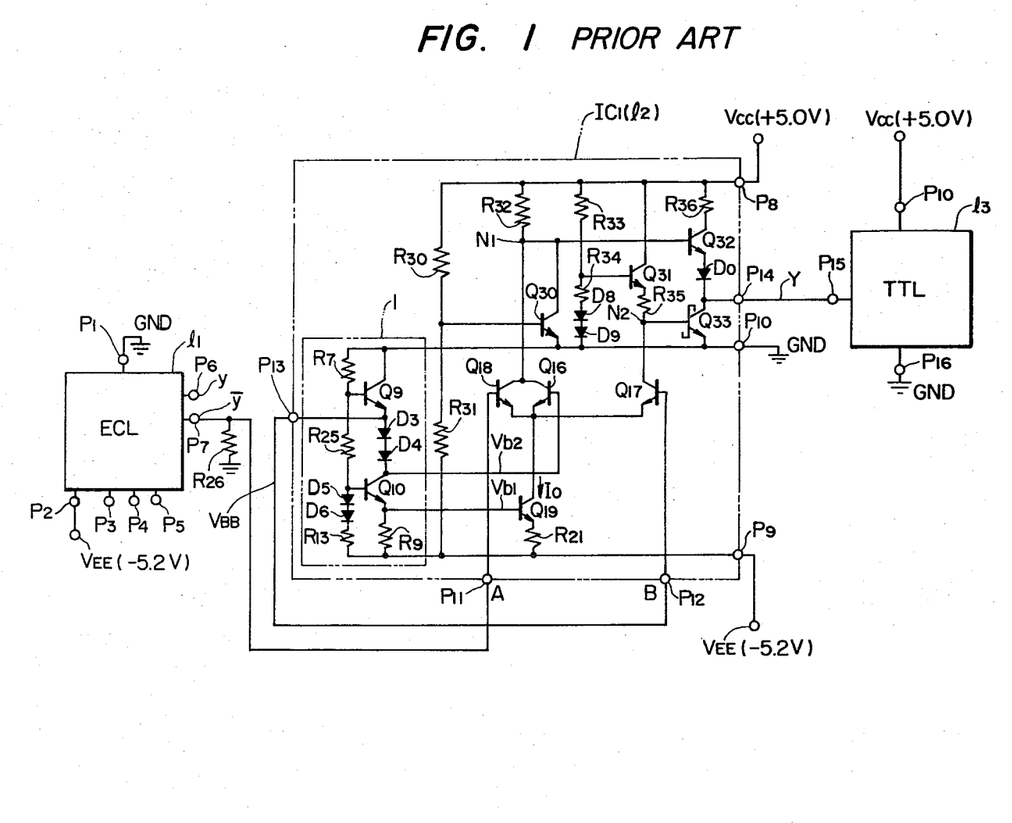
FIG. 1 is a circuit diagram of the heretofore known circuit.

The signal level conversion circuit $l_2$ includes a first input transistor $Q_{18}$ having its base connected to the first input terminal $P_{11}$, a second input transistor $Q_{17}$ having its base connected to the second input terminal $P_{12}$, a reference transistor $Q_{16}$ the base of which receives a negative second reference voltage $V_{b2}$ generated by a reference voltage generation circuit 1 and a current source transistor $Q_{19}$ the base of which receives a negative first reference voltage $V_{b1}$ generated by the reference voltage generation circuit 1. The reference voltage generation circuit 1 operates on the difference voltage between the negative power source voltage $V_{EE}$ and the ground potential (GND) and includes transistors $Q_9$ and $Q_{10}$, diodes $D_3$-$D_6$ and resistors $R_7$, $R_9$ and $R_{25}$. The emitter of the transistor $Q_9$ of the reference voltage generation circuit 1 is connected to a terminal $P_{13}$ and a negative third reference voltage $V_{BB}$ is obtained from this terminal $P_{13}$.

The collector of the first input transistor $Q_{18}$ and that of the reference transistor $Q_{16}$ are connected to a first load resistor $R_{32}$ at a first node $N_1$ and the collector of the second input transistor $Q_{17}$ is connected to a second load resistor $R_{35}$ at a second node $N_2$. When the first node $N_1$ becomes high level, the first output transistor $Q_{32}$ becomes conductive and an output signal of high level approximate to the positive power source voltage $V_{CC}$ is obtained at the output terminal $P_{14}$. On the other hand, when the second node $N_2$ becomes high level, the second output transistor $Q_{33}$ becomes conductive and an output signal of low level approximate to the ground potential (GND) is produced at the output terminal $P_{14}$. In this manner, the conversion output signal Y at the output terminal $P_{14}$ of the signal level conversion circuit $l_2$ varies substantially between the positive power source voltage $V_{CC}$ and the ground potential (GND) and is transmitted to the input terminal $P_{15}$ of the TTL circuit $l_3$.

By means of the connection arrangement outside the semiconductor integrated circuit, the output signal y of the ECL circuit $l_1$ is applied to the first input terminal $P_{11}$ of the signal level conversion circuit $l_2$ while the third reference voltage $V_{BB}$ is applied to the second input terminal $P_{12}$. In consequence, the phase of the conversion output signal Y at the output terminal $P_{14}$ of the signal level conversion circuit $l_2$ is opposite to the phase of the output signal $\bar{y}$ at the output terminal $P_7$ of the ECL circuit $l_1$.

Meanwhile, the negative power source voltage $V_{EE}$ for the first circuit such as the ECL circuit $l_1$ and the positive power source voltage $V_{CC}$ for the second circuit such as the TTL circuit involve the possibility of inducing the fluctuation of the power source voltages, respectively.

Further, the switching speed of the output signal Y at the output terminal $P_{14}$ of the signal level conversion circuit $l_2$ is determined by the switching characteristics of the first and second input transistors $Q_{18}$ and $Q_{17}$.

In order to keep the switching speed of the signal level conversion circuit $l_2$ at a high speed, therefore, the first and second input transistors $Q_{18}$ and $Q_{17}$ must be operated in the non-saturation mode. That is to say, when a bipolar transistor is driven into the saturation region, the base-collector junction is biased in the forward direction. Hence, the base layer and the collector layer cause minority carrier injection with each other and accumulation of this minority carrier markedly extends the switching time.

On the other hand, the reference voltage generation circuit 1 in the heretofore known signal level conversion circuit $l_2$ shown in FIG. 1 generates a first reference voltage $V_{b1}$ which depends upon the negative power source voltage $V_{EE}$ but not upon the positive power source voltage $V_{CC}$, and by this first reference voltage $V_{b1}$ is determined the value of a current $I_o$ flowing through the current source transistor $Q_{19}$. Hence, the value of this current $I_o$ depends upon the value of the negative power source voltage $V_{EE}$ but not upon that of the positive power source voltage $V_{CC}$.

Assume now that the output signal $\bar{y}$ at the output terminal $P_7$ of the ECL circuit $l_1$ is at a level which is approximate to the ground potential (GND). In this case, the second and third negative reference voltages $V_{b2}$ and $V_{BB}$ are impressed upon the base of the reference transistor $Q_{16}$ and upon that of the second input transistor $Q_{17}$, respectively. Hence, the first input transistor $Q_{18}$ becomes conductive while the reference transistor $Q_{16}$ and the second input transistor $Q_{17}$ remain non-conductive. Accordingly, the voltage $V_{N1}$ at the first node $N_1$ is given by the following equation;

$$V_{N1} = V_{CC} - R_{32} \cdot I_o \qquad (1)$$

When the negative power source voltage $V_{EE}$ is kept at a predetermined power source voltage (e.g., $-5.2$ V) while the positive power source voltage $V_{CC}$ drastically decreases from its predetermined power source voltage (e.g., $+5.0$ V) down to $+3.0$ V, for example, the first item on the right side of the above-mentioned equation (1) becomes smaller than the second item and hence, the voltage $V_{N1}$ at the first node $N_1$ becomes a negative voltage.

On the other hand, when the positive power source voltage $V_{CC}$ is kept at a predetermined power source voltage (e.g., 5.0 V) while the negative power source voltage $V_{EE}$ drastically increases from its predetermined power source voltage (e.g., $-5.2$ V) up to $-7.0$ V, for example, the value of the current $I_o$ flowing through the current source transistor $Q_{19}$ increases. Due to the increase of the current, therefore, the second item of the equation (1) becomes greater than the first item. Thus, the voltage at the first node $N_1$ becomes likewise a negative voltage.

Thus, the voltage $V_{N1}$ at the first node $N_1$ becomes a negative value due to the decrease of the positive power source voltage $V_{CC}$ or to the increase of the negative power source voltage $V_{EE}$. At this time, since the output signal $\overline{y}$, which is impressed upon the base of the first input transistor $Q_{18}$, is at a level of the ground potential (GND), the collector-base junction of the first input transistor $Q_{18}$ is biased in the forward direction and the first input transistor $Q_{18}$ is driven into the saturation region.

On the other hand, when the third reference voltage $V_{BB}$ is impressed upon the base of the first input transistor $Q_{18}$ and the output signal $\overline{y}$ of the ECL circuit $l_1$ is impressed upon the base of the second input transistor $Q_{17}$ in accordance with logic design of a data processing system, the voltage of the second node $N_2$ becomes negative owing to the decrease of the positive power source voltage $V_{CC}$ or to the increase of the negative power source voltage $V_{EE}$ and the second input transistor $Q_{17}$ is likewise driven into the saturation region.

In this manner, the saturation of the first input transistor $Q_{18}$ or that of the second input transistor $Q_{17}$, due to the fluctuation in the source voltage of the positive power source voltage $V_{CC}$ or the negative power source voltage $V_{EE}$, markedly retards the switching speed of the output signal Y at the output terminal $P_{14}$ of the signal level conversion circuit $l_2$.

To cope with the problem, a method has conventionally been proposed which prevents the saturation of the input transistor by connecting a clamping element such as a Shottky barrier diode to the collector of the input transistors of the signal level conversion circuit, as disclosed in Japanese Patent Laid-Open No. 51-120143, for example.

Though the clamping element such as the Shottky barrier diode is capable of preventing the saturation of the input transistors, the switching speed of the output signal of the signal level conversion circuit is retarded due to the parasitic capacity inherent to the clamping element.

Referring again to the heretofore known signal level conversion circuit shown in FIG. 1, it has been clarified that when the absolute value $|V_{EE}|$ of the negative power source voltage $-V_{EE}$ becomes below about 4 V, the reference transistor $Q_{16}$ as well as the current source transistor $Q_{19}$ are brought into the OFF state. It has also been clarified that the collector outputs $V_{N2}$, $V_{N1}$ of the transistors $Q_{17}$, $Q_{18}$ are at high levels irrespective of the input conditions as represented by the power source voltage characteristic $l_{71}$ in FIG. 7 whereby degradation of the characteristics of the output transistors $Q_{32}$ and $Q_{33}$ and their break-down occur.

This is because when the absolute value $|V_{EE}|$ of the negative power source voltage is not higher than about 4 V due to the base-emitter voltage of the transistor $Q_9$, to the voltages of the diodes $D_3$ and $D_4$ in the forward direction, to the collector-base voltage of the current source transistor $Q_{19}$ and to the voltage drop across the resistors $R_7$ and $R_{21}$, no current flows through them any longer.

SUMMARY OF THE INVENTION

It is therefore a first object of the present invention to provide a signal level conversion circuit having an expanded range of allowance for the fluctuation of power source voltages which is capable of high speed switching action to follow up the fluctuation of a negative power source voltage for a first circuit or that of a positive power source voltage for a second circuit.

It is a second object of the present invention to provide a level conversion circuit which improves a characteristic of a reduced power source voltage.

In a signal level conversion circuit $l_2$ (shown in FIG. 2) in accordance with the fundamental principle of the present invention to accomplish the above-described first object, the value of a current $I_o$ flowing through a current source transistor $Q_{19}$ connected to input transistors $Q_{17}$ and $Q_{18}$ depends upon both negative power source voltage $V_{EE}$ and positive power source voltage $V_{CC}$. The value of the current $I_o$ flowing through the current source transistor $Q_{19}$ is proportional to the difference of voltages between the negative power source voltage $V_{EE}$ and the positive power source voltage $V_{CC}$. Accordingly, when the value of the positive power source voltage $V_{CC}$ decreases, for example, the voltage drop across load resistors $R_{18}$ and $R_{19}$ connected between the positive power source voltage $V_{CC}$ and collectors of input transistors $Q_{17}$ and $Q_{18}$ is reduced due to the decrease of the current flowing through the current source transistor $Q_{19}$. Hence, the drop of the collector potentials of the input transistors $Q_{17}$ and $Q_{18}$ resulting from the decrease of the positive power source $V_{CC}$ is offset by the decrease of the voltage drop across the load resistors $R_{18}$ and $R_{19}$.

In the level conversion circuit (FIG. 8) in accordance with the fundamental principle of the present invention to accomplish the above-described second object, a bias voltage $V_{N4}$ for a protection transistor $Q_{12}$ and a bias voltage $V_{N7}$ for a constant current transistor $Q_{15}$ are formed on the basis of a voltage division output of a voltage division circuit 2 disposed between the positive power source voltage $V_{CC}$ and the negative power source voltage $V_{EE}$.

DESCRIPTION OF THE PREFERRED EMBODIMENT

Hereinafter, the preferred embodiments of the present invention will be explained in detail.

Figure 2:
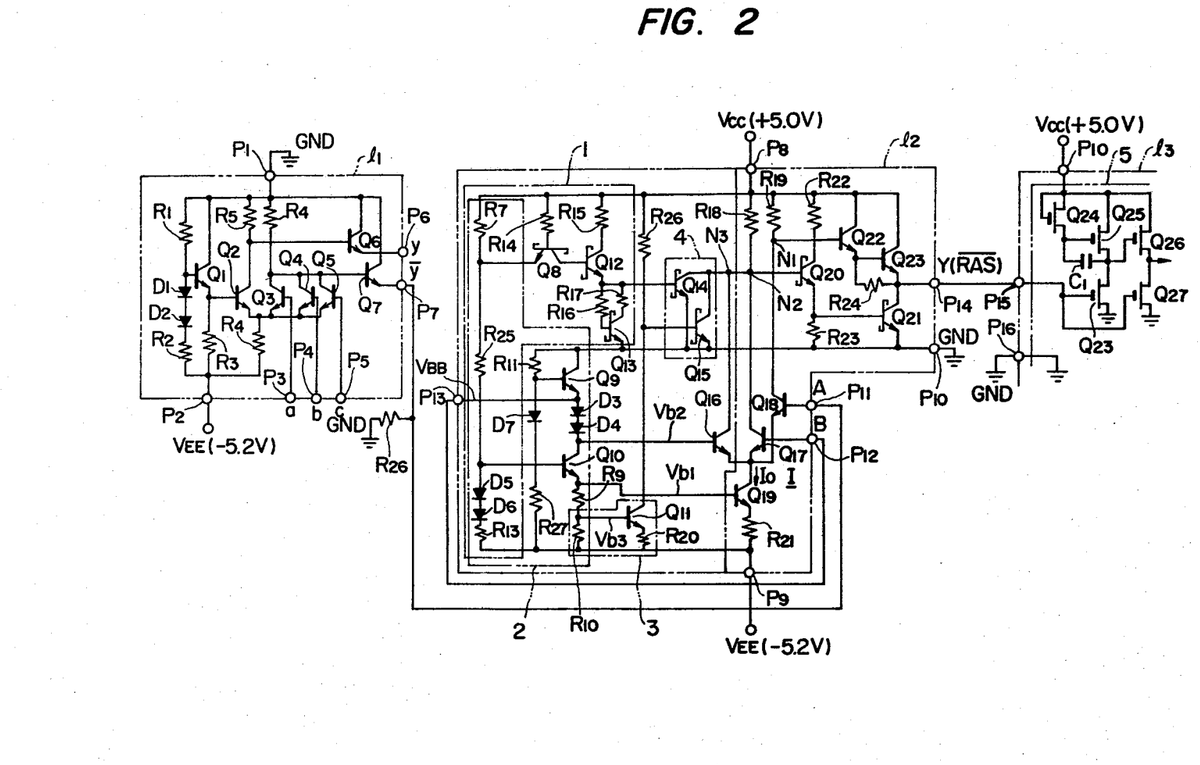
FIG. 2 is a circuit diagram of an embodiment of the present invention.

FIG. 2 is a circuit diagram showing the signal level conversion circuit $l_2$ of an embodiment of the present invention together with the ECL circuit $l_1$ and the N-MOS memory $l_3$.

Though not limited in particular, the abovementioned ECL circuit $l_1$ comprises a bias circuit consisting of resistors $R_1$–$R_3$, diodes $D_1$ and $D_2$ and a transistor $Q_1$ and a logic circuit consisting of resistors $R_4$–$R_6$ and transistors $Q_2$–$Q_7$ as shown in the drawing.

Input signals a–c from terminals $P_3$–$P_5$ are impressed upon the bases of the transistors $Q_3$–$Q_5$, respectively. At the emitter (output terminal $P_7$) of the transistor $Q_7$ is produced an output signal of the NOR logic $\overline{y}$ of the signals a–c.

One of power terminals $P_1$ of the abovementioned ECL circuit $l_1$ is connected to a ground potential point (GND) of the circuit and the other $P_2$ is connected to a negative power terminal $V_{EE}$ of −5.2 V, for example. The input and outputs signals of the ECL circuit $l_1$ are set to a high level of −0.89 V, for example, and to a low level of −1.69 V, for example, respectively.

The signal level conversion circuit $l_2$ in accordance with the embodiment of the present invention is formed on one semiconductor substrate by a known monolithic semiconductor integrated circuit technique.

One of power terminals $P_8$ of this signal level conversion circuit is connected to a positive power terminal $V_{CC}$ of 5 V, for example, the second $P_9$, to the negative power terminal $V_{EE}$ and the third $P_{10}$, to the ground potential point (GND).

The bias circuit 2 is especially connected between the positive power terminal $V_{CC}$ and the negative power terminal $V_{EE}$ in accordance with the principle of the present invention as shown in the drawing and operates on the voltage difference between the positive power source and the negative power source. The bias circuit 2 produces a bias voltage $V_{BB}$ which is at an almost intermediate level of the ECL signal level, e.g., −1.29 V, at the junction between the emitter of the transistor $Q_9$ and the anode of the diode $D_3$ and also produces a bias voltage $V_{b2}$ which is lower than the low level of the ECL signal level, e.g., −1.69 V, at the junction between the cathode of the diode $D_4$ and the collector of the transistor $Q_{10}$. It also produces a bias voltage $V_{b1}$ for a current source transistor $Q_{19}$ at the junction between the emitter of the transistor $Q_{10}$ and the resistor $R_6$, and a bias voltage $V_{b3}$ for the transistor $Q_{11}$ at the junction between the resistor $R_9$ and the resistor $R_{10}$.

In the level conversion circuit $l_2$, the transistor $Q_{19}$ forms a current source transistor, the transistor $Q_{18}$ forms a first input transistor and the transistor $Q_{17}$ forms a second input transistor.

At its base, the abovementioned second input transistor $Q_{17}$ receives the reference bias voltage $V_{BB}$ of the intermediate level of the ECL signal level from the constant voltage bias circuit 2 via terminals $P_{13}$ and $P_{12}$ while the transistor $Q_{18}$ receives the output signal $\overline{y}$ from the abovementioned ECL circuit $l_l$ via the terminals $P_7$ and $P_{11}$. To these first and second input transistors $Q_{18}$ and $Q_{17}$ is connected a reference transistor $Q_{16}$ so as to be capable of operating differentially. The bias voltage $V_{b2}$ from the bias circuit 2 is applied to the base of this reference transistor $Q_{16}$. Accordingly, when the output signal $\overline{y}$ of the abovementioned ECL circuit $l_1$ is at high level, the transistor $Q_{17}$ is in the OFF state while the transistor $Q_{18}$ is in the ON state. On the contrary, when the output signal $\overline{y}$ of the ECL circuit $l_1$ is at low level, the state of each transistor $Q_{17}$, $Q_{18}$ is reversed.

The collector of the first input transistor $Q_{18}$ is connected to the positive power terminal $V_{CC}$ via a first load resistor $R_{19}$ and the collector of the second input transistor $Q_{17}$ is also connected to the positive power terminal $V_{CC}$ via a second load resistor $R_{18}$.

When the transistor $Q_{17}$ or $Q_{18}$ is turned on, a current $I_o$ of the current source transistor $Q_{19}$ flows through the resistor $R_{18}$ or $R_{19}$, thus generating a voltage drop at the resistor $R_{18}$ or $R_{19}$. As a result, a signal of the opposite phase is produced at the collector of each transistor $Q_{17}$, $Q_{18}$ in accordance with the input signal of the ECL level. In this case, it is possible to render the low level of the collector output signal of each transistor $Q_{17}$, $Q_{18}$ substantially equal to the ground potential (GND) such as +0.3 V, for example, by selecting suitable values for the resistors $R_{18}$ and $R_{19}$.

The collector output signals of the transistors $Q_{17}$ and $Q_{18}$ are respectively applied to the bases of cascaded output transistors $Q_{21}$ and $Q_{23}$ via emitter follower transistors $Q_{20}$ and $Q_{22}$. The output transistors $Q_{21}$ and $Q_{23}$ are operated in the opposite phases to one another by the collector outputs of the differential pair transistors $Q_{17}$ and $Q_{18}$. As a result, at the output terminal $P_{14}$, there is produced an output signal Y which is converted into a positive voltage system in response to the input signal of the ECL level and is capable of sufficiently driving a heavy load such as a capacitive load.

The output signal Y of the signal level conversion circuit $l_2$ substantially changes between the positive power source voltage $V_{CC}$ and the ground potential point (GND) and is impressed upon the input terminal $P_{15}$ of the N channel MOS circuit $l_3$. The N-MOS circuit $l_3$ includes N-channel insulated gate field effect transistors $Q_{23}$, $Q_{24}$, $Q_{25}$, $Q_{26}$ and $Q_{27}$. One of its power terminals $P_{10}$ is connected to the positive power terminal of +5.0 V, for example, while the other power terminal $P_{16}$ is connected to the ground potential point (GND).

In the bias circuit 2 in accordance with the principle of the present invention, resistors $R_{25}$ and $R_{13}$ are connected in series between the positive power terminal $V_{CC}$ and the negative power terminal $V_{EE}$. The voltage produced at the junction of these resistors $R_{25}$ and $R_{13}$ is proportional to the difference of the voltage between the positive power voltage $V_{CC}$ and the negative power voltage $V_{EE}$ and determines the bias voltage $V_{b1}$ to be impressed upon the base of the current source transistor $Q_{19}$. Though the junction between the resistors $R_{25}$ and $R_{13}$ may be directly connected to the base of the current source transistor $Q_{19}$, it is preferably connected to the base of the current source transistor $Q_{19}$ via the base-emitter junction of the emitter follower transistor $Q_{10}$. In a further preferred embodiment of the present invention, the diodes $D_5$ and $D_6$ are connected in series to the resistor $R_{13}$ for the compensation of the temperature characteristic of the base-emitter junctions of the transistors $Q_{10}$ and $Q_{19}$.

In the preferred embodiment of the present invention, resistors $R_{11}$ and $R_{27}$ are cascaded between the ground potential point (GND) and the negative power terminal $V_{EE}$ in the bias circuit 2. The voltage produced at the junction between these resistors $R_{11}$ and $R_{27}$ is proportional to the power source voltage of the negative power voltage $V_{EE}$ and determines the reference bias voltage $V_{BB}$ as well as the bias voltage $V_{b2}$.

Assume now that the output signal $\overline{y}$ at the output terminal $P_7$ of the ECL circuit $l_1$ is at a level approximate to the ground potential (GND). Since the bias voltage $V_{b2}$ and the bias voltage $V_{BB}$ are impressed upon the base of the reference transistor $Q_{16}$ and upon that of the second input transistor $Q_{17}$, respectively, the first input transistor $Q_{18}$ becomes conductive whereas the reference transistor $Q_{16}$ and the second input transistor $Q_{17}$ become non-conductive. Accordingly, the potential $V_{N1}$ at the first node $N_1$ where the first load resistor $R_{19}$ is connected to the collector of the first input transistor $Q_{18}$ is given by the following equation;

$$V_{N1} = V_{CC} - R_{19} \cdot I_o \qquad (2)$$

On the other hand, the value of the current $I_o$ flowing through the current source transistor $Q_{19}$ is especially rendered proportional to the voltage difference between the positive power source voltage $V_{CC}$ and the negative power source voltage $V_{EE}$ in accordance with the principle of the present invention.

Accordingly, when the negative power source voltage $V_{EE}$ is kept at a predetermined power source voltage value (e.g., $-5.2$ V) while the positive power source voltage $V_{CC}$ drops drastically from a predetermined power source voltage (e.g., $+5.0$ V) down to $+3.0$ V, for example, the value of the current $I_o$ flowing through the current source transistor $Q_{19}$ drops drastically. For this reason, even when the power source voltage value of the positive power source voltage $V_{CC}$ drops drastically from the predetermined value, the first and second items of the right side of the abovementioned equation (2) become small values.

Assume now the case where the positive power source voltage $V_{CC}$ is kept at a predetermined power source voltage value (e.g., 5.0 V) while the negative power source voltage $V_{EE}$ changes drastically (from $-5.2$ V, for example) to $-7.0$ V, for example. In this case, in the heretofore known signal level conversion circuit $l_2$ (in FIG. 1), the value of the current $I_o$ flowing through the current source transistor $Q_{19}$ changes drastically depending exclusively upon the voltage value of the negative power source voltage $V_{EE}$, whereas in the signal level conversion circuit $l_2$ of the present invention (in FIG. 2), the value of the current $I_o$ flowing through the current source transistor $Q_{19}$ is determined by the voltage difference between the positive power source voltage $V_{CC}$ and the negative power source voltage $VEE$. Accordingly, the change of the current $I_o$ due to the change of the negative power source voltage $V_{EE}$ becomes smaller than that in the prior art.

As described above, since the value of the current $I_o$ flowing through the current source transistor $Q_{19}$ changes in proportion to the voltage difference between the positive power source voltage $V_{CC}$ and the negative power source voltage $V_{EE}$ in the present invention, the potential $V_{N1}$ at the first node $N_1$ does not much change with the change of the positive power source voltage $V_{CC}$ or that of the negative power source voltage $V_{EE}$ and is kept substantially at a constant level.

On the other hand, it has become obvious that when the positive power source voltage and the negative power source voltage to be used change or when the sequence of the feed changes in making use of the signal level conversion circuit, signals of undesirable levels are applied to the N-MOS memory so that the memory tends to operate erroneously.

As will be explained next, the signal level conversion circuit $l_2$ (in FIG. 2) in accordance with the embodiment of the present invention operates in such a manner as to keep the output signal Y of the push-pull output circuit ($Q_{21}$, $Q_{23}$) at a preferable high level even in such cases where the power source voltages $V_{CC}$ and $V_{EE}$ fluctuate, the feed sequence of the voltages $V_{CC}$ and $V_{EE}$ changes at the start of the feed of power and the input terminals $P_{11}$ and $P_{12}$ undesirably open.

The reason why the signals of undesirable levels are applied to the N-MOS memory due to the change in the negative power source voltage $V_{EE}$ in the signal level conversion circuit $l_2$ (in FIG. 2) will be discussed. The reason resides in the fact that the negative power source voltage has such a critical value $V_{EE}$ (crit) that when the power source voltage decreases, the bias current flowing through the series current path consisting of the transistor $Q_9$, the diodes $D_3$ and $D_4$, the transistor $Q_{10}$ and the resistors $R_9$ and $R_{10}$ of the constant voltage bias circuit 2 becomes substantially zero. When the absolute value of the negative power source voltage $V_{EE}$ becomes lower than this critical value $V_{EE}$ (crit), the bias voltage $V_{b1}$ obtained from the emitter of the transistor $Q_{10}$ becomes substantially zero and the current source transistor $Q_{19}$ is eventually cut off.

The cut-off state of the constant current transistor $Q_{19}$ brings both differential pair transistors $Q_{17}$ and $Q_{18}$ into the OFF state.

When the switching transistor $Q_{15}$ is not disposed in the $V_{EE}$ detection circuit 3 and in the switching circuit 4, both collector outputs of the differential pair transistors $Q_{17}$ and $Q_{18}$ become simultaneously high level upon turn-off of both transistors whereby all of the emitter follower transistors $Q_{20}$, $Q_{22}$ and the output transistors $Q_{23}$, $Q_{21}$ of the push-pull circuit of the signal level conversion circuit $l_2$ (in FIG. 2) are turned on. This state not only produces, as the output signal Y, the low level (ground potential) causing the erroneous operation of the N-MOS memory from the output terminal $P_{14}$ but also allows a large current to simultaneously flow through the output transistors $Q_{23}$ and $Q_{21}$ and to eventually break down these transistors.

By contrast, in accordance with the embodiment of the present invention, there are provided the $V_{EE}$ detection control circuit 3 and the switching circuit 4. More particularly, the base of the detection transistor $Q_{11}$ in the $V_{EE}$ detection circuit 3 is connected to the junction between the resistors $R_9$ and $R_{10}$ and is supplied with a bias voltage $V_{b3}$ which is smaller than the bias voltage $V_{b1}$ obtained from the emitter of the transistor $Q_{10}$. Accordingly, the transistor $Q_{11}$ of the $V_{EE}$ detection control circuit 3 is cut off before the current source transistor $Q_{19}$ is cut off when the absolute value of the negative power source voltage $V_{EE}$ becomes smaller than the abovementioned critical value $V_{EE}$ (crit). Hence, the collector output of the transistor $Q_{11}$ becomes high level (positive power source voltage $V_{CC}$) and the transistor $Q_{15}$ of the switching circuit 4 is in the ON state. Since the collector of the transistor $Q_{15}$ is connected to the base of the emitter follower transistor $Q_{20}$ of the push-pull output circuit, the emitter follower transistor $Q_{20}$ as well as the output transistor $Q_{21}$ become in the OFF state as soon as the transistor $Q_{15}$ is turned on. As the output transistor $Q_{21}$ is in the OFF state, both emitter follower transistor $Q_{22}$ and output transistor $Q_{23}$ become ON whereby the output signal Y of the high level is obtained from the output terminal $P_{14}$ and the output transistors $Q_{21}$ and $Q_{23}$ can be protected from the break-down.

Figure 5:
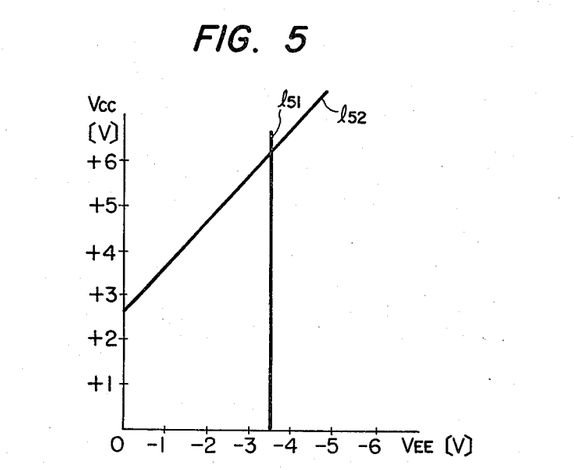
FIG. 5 is a characteristic curve of the circuit of FIG. 2.

Accordingly, in the $V_{EE}$ detection control circuit 3 and in the switching circuit 4, the negative power source voltage $V_{EE}$ changes from the right-hand portion to the left as viewed from the line $l_{51}$ in FIG. 5 and when it exceeds the line $l_{51}$, it changes compulsively the output signal Y of the output terminal $P_{14}$ to the high level. The value of the positive power source voltage $V_{CC}$ required for the $V_{EE}$ detection control circuit 3 and the switching circuit 4 to accomplish this compulsive circuit operation is a minimum value required for the transistor $Q_{15}$ to be brought into the ON state by means of the current flowing through the base of the transistor $Q_{15}$ of the switching circuit 4 through the resistor $R_{26}$.

On the other hand, voltages of suitable values are applied to the positive power source voltage $V_{CC}$ and to the negative power source voltage $V_{EE}$, respectively. When the output signal $\bar{y}$ of the ECL circuit $l_1$ is at low level, one transistor $Q_{17}$ of the differential pair transistors $Q_{17}$ and $Q_{18}$ is in the ON state and its collector output is at low level while the other transistor $Q_{18}$ is in the OFF state. In this case, the low level collector output of the transistor $Q_{17}$ brings the transistors $Q_{20}$ and $Q_{21}$ of the push-pull output circuit into the OFF state while the high level collector output of the transistor $Q_{18}$ brings the transistors $Q_{22}$ and $Q_{23}$ of the push-pull output circuit into the ON state.

However, there is a possibility that even when the output signal $\bar{y}$ of the ECL circuit $l_1$ is at low level and the transistor $Q_{18}$ is in the OFF state with the transistor $Q_{17}$ in the ON state, the low level collector output of the transistor $Q_{17}$ changes to follow up the change in the positive power source voltage $V_{CC}$ or in the negative power source voltage $V_{EE}$.

In other words, if the $V_{CC}\cdot V_{EE}$ detector circuit 1 and the switching circuit 4 are not provided, the voltage level of the low level collector output of the transistor $Q_{17}$, which is in the ON state, becomes ($V_{N2} = V_{CC} - R_{18}\cdot I_o$) with $I_o$ being a constant current flowing through the current source transistor $Q_{19}$. Accordingly, the voltage level of the collector output of the transistor $Q_{17}$ changes from the low level towards the high level in accordance with the rise of the absolute value of the positive power source voltage $V_{CC}$ or with the decrease of the constant current $I_o$. The decrease of the constant current $I_o$ flowing through the current source transistor $Q_{19}$ is generated by the decrease of the absolute value of the negative power source voltage $V_{EE}$. When the voltage level of the low level collector output of the transistor $Q_{17}$ expressed by ($V_{N2} = V_{CC} - R_{18}\cdot I_o$) changes towards the high level due to the rise of the absolute value of the positive power source voltage $V_{CC}$ or to the decrease of the absolute value of the negative power source voltage $V_{EE}$, the transistors $Q_{20}$ and $Q_{21}$ of the output push-pull circuit become in the ON state. At this time, the other $Q_{18}$ of the differential pair transistors $Q_{17}$ and $Q_{18}$ is in the OFF state and the transistors $Q_{22}$ and $Q_{23}$ of the output push-pull circuit have already been in the ON state. Hence, there occurs a possibility that the output transistors $Q_{23}$ and $Q_{21}$ are broken down due to a penetrating current flowing their series circuit and a low level output signal Y is undesirably generated at the output terminal $P_{14}$ as the output transistor $Q_{21}$ is in the ON state.

By contrast, in accordance with the embodiment $l_2$ (in FIG. 2) of the present invention, there are provided the $V_{CC}\cdot V_{EE}$ detection circuit 1 and the switching circuit 4. Especially, the base of the detection transistor $Q_8$ in the $V_{CC}\cdot V_{EE}$ detection circuit 1 is connected to the positive power source voltage $V_{CC}$ via the resistor $R_{14}$ and the emitter is connected to a common junction of the two cascaded resistors $R_7$ and $R_{25}$ between the positive power source voltage $V_{CC}$ and the negative power source voltage $V_{EE}$ with the collector connected to the base of the emitter follower transistor $Q_{12}$. The emitter of this transistor $Q_{12}$ is connected to a circuit network consisting of the resistors $R_{16}$, $R_{17}$ and the transistor $Q_{13}$ and further to the base of the switching transistor $Q_{14}$.

Accordingly, when the rise of the absolute value of the positive power source voltage $V_{CC}$ or the drop of the absolute value of the negative power source voltage $V_{EE}$ exceeds a detection level that is determined by the resistors $R_7$, $R_{25}$, $R_{13}$, the diodes $D_5$, $D_6$ and so forth, the emitter voltage of this detection transistor $Q_8$ rises. As a result, a sufficient base current is fed to the emitter follower transistor $Q_{12}$ via a Shottky diode interposed between the collector and base of the detection transistor $Q_8$, whereby the switching transistor $Q_{14}$ is turned ON. As the transistor $Q_{14}$ is thus in the ON state, it protects the output transistors $Q_{21}$ and $Q_{23}$ from breakdown in the same way as the switching transistor $Q_{15}$ and changes the output signal Y at the output terminal $P_{14}$ to the high level.

In FIG. 5, the range above the line $l_{52}$ represents a range of the power source voltage in which the transistor $Q_{14}$ of the abovementioned switching circuit 4 is in the ON state. In other words, when the absolute value of the positive power source voltage rises or the absolute value of the negative power source voltage drops, the power source voltage value approaches from the range below the line $l_{52}$ towards the upper range so that when the power source voltage exceeds the line $l_{52}$ before the transistors $Q_{20}$ and $Q_{21}$ change undesirably from the OFF state to the ON state, the transistor $Q_{14}$ of the switching circuit 4 becomes ON. It is thus possible to keep the transistors $Q_{20}$ and $Q_{21}$ of the output push-pull circuit in the OFF state.

The reference transistor $Q_{16}$ is employed in order to compulsively keep the signal of the output terminal $P_{14}$ at the high level when the terminals $P_{11}$ and $P_{12}$ are undesirably opened. Namely, when the terminals $P_{11}$ and $P_{12}$ are opened, the transistors $Q_{17}$ and $Q_{18}$ become OFF since the base current becomes zero (O). The emitter of the transistor $Q_{16}$ is commonly connected to those of the transistors $Q_{17}$ and $Q_{18}$ and forms a current switch together with these transistors $Q_{17}$ and $Q_{18}$. Hence, when the transistors $Q_{17}$ and $Q_{18}$ become OFF, the reference transistor $Q_{16}$ becomes ON. As a result, the constant current $I_o$ of the current source transistor $Q_{19}$ flows through the resistor $R_{18}$ via the transistor $Q_{16}$. Due to the voltage drop of the resistor $R_{18}$, the transistors $Q_{20}$ and $Q_{21}$ become OFF with the consequence that the signal of the output terminal $P_{14}$ becomes high level.

As described above, the transistor $Q_{16}$ is arranged in such a manner that its base receives from the constant voltage bias circuit a bias voltage of a lower voltage level than the ECL signal level. Consequently, the transistor $Q_{16}$ is in the OFF state while the ECL level signal and the signal of the aforementioned intermediate level are applied to the terminals $P_{11}$ and $P_{12}$.

Heretofore known N-MOS memories may be used in the present invention without any restriction in particular. As shown in the block diagram of FIG. 3, for example, the N-MOS memory consists of a clock signal generation circuit 6 which receives a row address strobe signal $\overline{RAS}$ and generates a clock signal for a row address data input; a clock signal generation circuit 8 which receives the row address strobe signal $\overline{RAS}$ and a column address strobe signal $\overline{CAS}$ through a gate circuit 7 and generates a clock signal for the column address data input; a control circuit 9 which receives the clock signals from the clock signal generating circuits 6 and 8 and controls an address buffer circuit 13 and an address decoder circuit 14; a buffer circuit 10 which receives a chip selection signal $\overline{CS}$; a gate circuit 12 which receives the output signals of the clock signal generation circuit 8 and the buffer circuit 10 and produces enable signals to the address decoder circuit 14 and to a data buffer circuit 17; a gate circuit 11 which receives a write control signal $\overline{WRITE}$ and the output signal of the gate circuit 7 and controls a write clock signal generation circuit 15; a data input buffer circuit 16 which is controlled by the output signal of the write clock signal generation circuit 15; memory arrays 18 and 18'; preamplifier groups 19; and an input-output data selection circuit 20.

Figure 4:
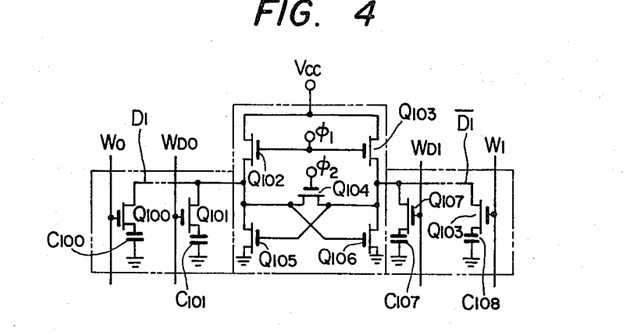
FIG. 4 is a circuit diagram of a memory cell and preamplifier.

FIG. 4 shows an example of the memory cell and preamplifier. As shown in the drawing, the memory cell comprises, for example, an N channel insulated gate field effect transistor (hereinafter called "MOSFET") $Q_{100}$ having its gate connected to the word line $W_o$ of the address decoder circuit 14, and a data storage capacitor $C_{100}$. The preamplifier comprises MOSFETs $Q_{102}$ and $Q_{103}$ for receiving the clock signal $\phi_1$ and MOSFET $Q_{104}$ for receiving the clock signal $\phi_0$ and MOSFETs $Q_{105}$ and $Q_{106}$ having their gates and drains mutually connected crosswise. To the data line $D_1$ of the preamplifier is connected a dummy cell ($Q_{107}$, $C_{107}$) for providing a reference potential to the data line $\overline{D_1}$, said reference potential determined when a memory to be connected to the data line $D_1$ is selected. To the data line $\overline{D_1}$ is likewise connected a dummy cell ($Q_{101}$, $C_{101}$).

Generally, the N-MOS memory is equipped at its input terminals with an inverter having a bootstrap function as a buffer circuit and receives the low level of the input signal as a data signal, for the reason to be later explained.

Figure 3:
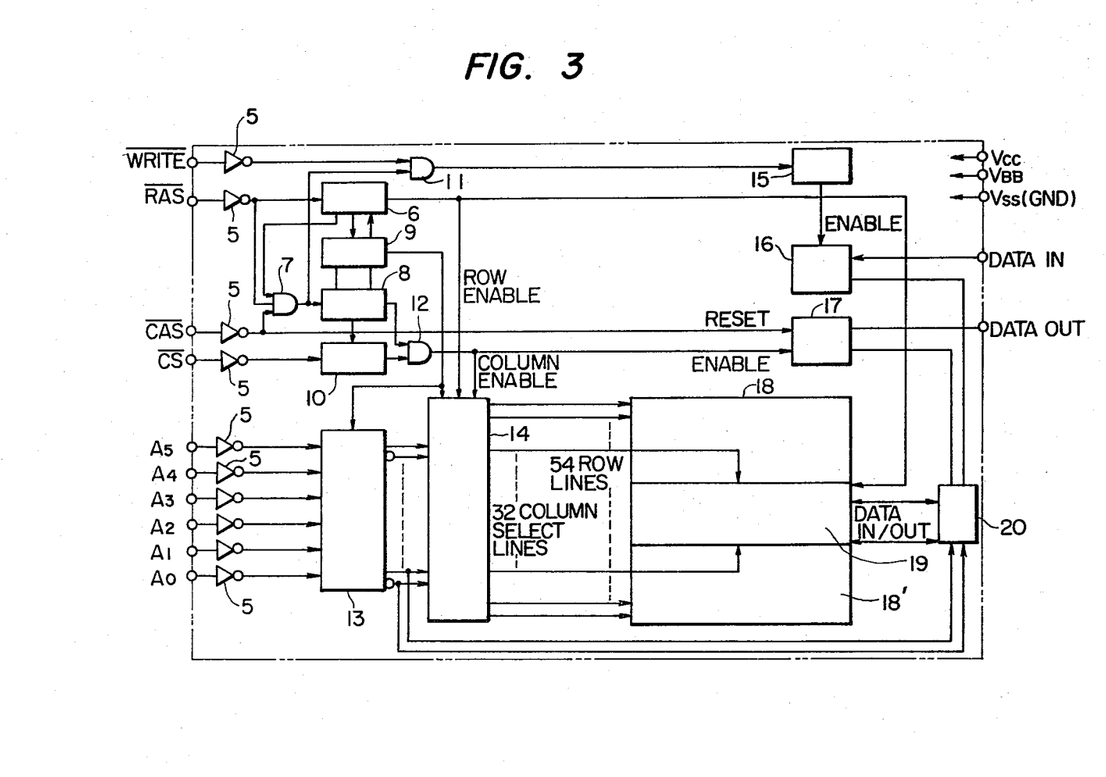
FIG. 3 is a block diagram of a MOS memory.

Though not restrictive, the input buffer circuit 5 of FIG. 3 comprises the MOSFETs $Q_{23}$-$Q_{27}$ and the capacitor $C_1$ like the circuit 5 of FIG. 2, for example. The MOSFETs $Q_{23}$-$Q_{25}$ and the capacitor $C_1$ together form the inverter circuit while the MOSFETs $Q_{26}$ and $Q_{27}$ together form the push-pull circuit.

When the signal of the terminal $P_{15}$ is at high level, the MOSFET $Q_{23}$ is turned on and hence, the output of the inverter circuit is at low level substantially equal to the ground potential. At this time, the capacitor $C_1$ is charged to a value $[V_{CC}-V_{th}]$ which is the balance obtained by subtracting the threshold voltage $V_{th}$ of the diode-connected MOSFET $Q_{24}$ from the approximate power source voltage $V_{CC}$.

When the signal of the terminal $P_{15}$ changes from the abovementioned high level to low level, the MOSFET $Q_{23}$ is in the OFF state so that the output signal level of the inverter circuit starts rising. In this case, since the capacitor $C_1$ has in advance been charged near the above-mentioned value $[V_{CC}-V_{th}]$, the gate voltage of the MOSFET $Q_{25}$ becomes sufficiently high. As a result, the ON-resistance of the MOSFET $Q_{25}$ becomes sufficiently small. As the ON-resistance of the MOSFET $Q_{25}$ becomes sufficiently low, the stray capacitance (not shown) at the output side of the inverter circuit is rapidly charged and the output signal of the inverter circuit rises at a high speed. When the gate voltage of the MOSFET $Q_{25}$ becomes higher than the power source voltage $V_{CC}$ owing to the bootstrap effect of the capacitor $C_1$, the output signal level of the inverter circuit rises close to the power source voltage $V_{CC}$, although the MOSFET $Q_{25}$ has the threshold voltage.

While a steady low level signal is being applied to the terminal $P_{15}$, the stored charge of the capacitor $C_1$ is reduced by a leakage current and the output voltage of the inverter circuit rises only to a value $[V_{CC}-2V_{th}]$ which is the difference obtained by subtracting the threshold voltage $V_{th}$ of the MOSFET $Q_{24}$ and that of the $Q_{25}$ from the power source voltage $V_{CC}$. When the signal of the terminal $P_{15}$ is changed from the low level to the high level, therefore, the amplitude of the output signal of the inverter circuit becomes small so that the amplitude and the changing speed of the output circuit ($Q_{26}$, $Q_{27}$) become small correspondingly.

Figure 6:
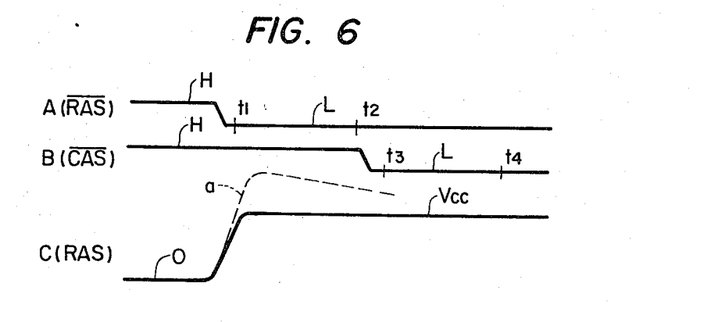
FIG. 6 is a waveform chart of the MOS memory circuit of FIG. 3.

In order to increase the operation speed, the MOS memory is allowed to receive such signals that are at high level H at the time of non-operation and are at low level L at the time of operation as represented by A and B in FIG. 6.

In FIG. 6, A represents the change of the row address strobe signal $\overline{RAS}$ and B represents the change of the column address strobe signal $\overline{CAS}$. Symbol C represents the change of the output signal of the inverter circuit (in FIG. 2) to receive the abovementioned signal $\overline{RAS}$. Dash line a represents the change of the gate potential of the MOSFET $Q_{25}$ at this time.

As described above, the MOS memory driving circuit $l_2$ of the embodiment of the invention shown in FIG. 2 is so constructed as to generate the high level signal when it is not expected to operate normally due to the fluctuation of the power source voltage $V_{CC} \cdot V_{EE}$, change of the mode of feeding the power source voltages $V_{CC}$ and $V_{EE}$, the state of opening of the input terminals $P_{11}$ and $P_{12}$, and so forth. Hence, the MOS memory is prevented from operating erroneously.

Figure 8:
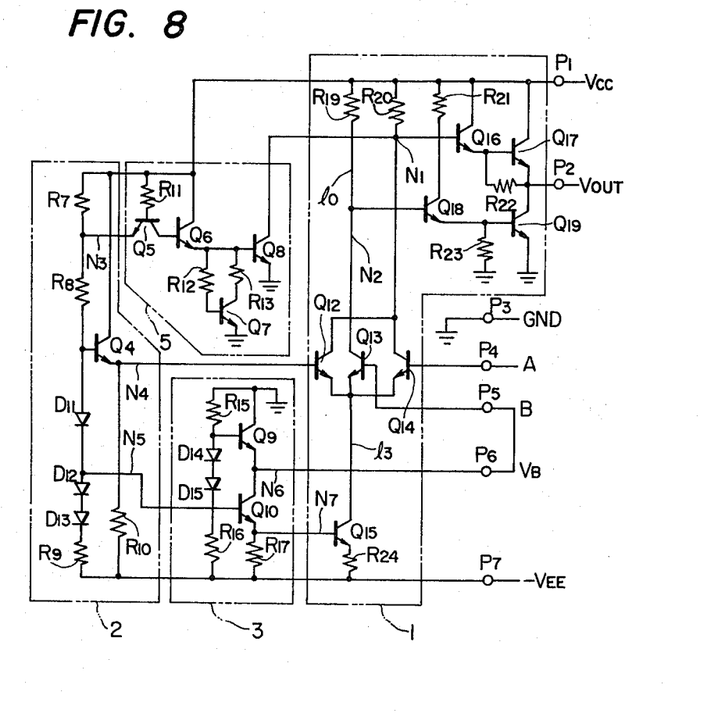
FIG. 8 is a circuit diagram of another embodiment of the present invention.

FIG. 8 shows the signal level conversion circuit in accordance with the embodiment of the present invention, which accomplishes the second object of the invention. This circuit is constructed in the monolithic semiconductor integrated circuit (IC) by the known technique and $P_1$ through $P_7$ are employed as external terminals of the IC.

To the terminal $P_1$ is applied a positive power source voltage $V_{CC}$ of $+5$ V, for example, while a negative power source voltage of $-5.2$ V, for example, is applied to the terminal $P_7$. The terminal $P_3$ is kept at the ground potential (GND) of the circuit.

In the drawing, the portion encompassed by two-dot chain line 1 forms a level conversion portion and the portions encompassed by two-dot chain lines 2 and 3 form bias portions, respectively.

The bias portion 2 consists of resistors $R_7$-$R_{10}$, a transistor $Q_4$ and diodes $D_{11}$-$D_{13}$, and is interposed between the abovementioned terminals $P_1$ and $P_7$. Upon receiving the positive power source voltage $V_{CC}$ and the negative power source voltage $V_{EE}$, the bias portion 2 generates bias voltages at nodes $N_3$-$N_5$, respectively.

The bias voltage $V_{N3}$ at the node $N_3$ is utilized as a bias voltage for a power source voltage detection portion 5. The voltage value of this bias voltage $V_{N3}$ is set such that it is lower than $2\,V_{BE}$, the sum of the base-emitter voltage $V_{BE}$ in the forward direction of a transistor $Q_6$ and that of a transistor $Q_8$ of the power source voltage detection portion 5 when the power source voltages $V_{CC}$ and $V_{EE}$ are within the normal ranges. On the other hand, the bias voltage $V_{N3}$ is set such that it becomes higher than $2\,V_{BE}$ when the positive power source voltage $V_{CC}$ increases from the normal value and when the absolute value of the negative power source voltage $V_{EE}$ decreases from the normal value.

The bias voltage $V_{N4}$ is utilized as a bias voltage for a transistor $Q_{12}$ of the level conversion portion 1. This bias voltage $V_{N4}$ is set such that it is at a lower level than the level of the ECL signal applied to the external terminal $P_4$ or $P_5$ of the IC.

The bias voltage $V_{N5}$ at the node $N_5$ is utilized as a bias voltage for a transistor $Q_{10}$ of the bias portion 3.

The bias portion 3 consists of resistors $R_{15}$ through $R_{17}$, diodes $D_{14}$ and $D_{15}$ and transistors $Q_9$ and $Q_{10}$ and is interposed between the ground (GND) and the negative power source terminal $P_7$ of the circuit. This bias portion 3 produces bias voltages $V_B$ and $V_{N7}$ at the nodes $N_6$ and $N_7$, respectively.

The bias voltage $V_B$ at the node $N_6$ is set to the intermediate level of the level of the ECL signal. When the high level of the ECL signal is $-0.89$ V with the low level being $-1.69$ V, the reference bias voltage $V_B$ at the node $N_6$ is set to $-1.29$ V by selecting suitable values for the resistors $R_{15}$ and $R_{16}$.

The bias voltage $V_{N7}$ at the node $N_7$ is utilized as a bias voltage for a current source transistor $Q_{15}$ of the level conversion portion 1.

The level conversion portion 1 consists of the abovementioned current source transistor $Q_{15}$ having an emitter resistor $R_{24}$, differential pair transistors $Q_{13}$ and $Q_{14}$ with their respective collector load resistors $R_{19}$ and $R_{20}$, transistors $Q_{16}$-$Q_{19}$ of a single end push-pull construction in the Darlington arrangement and resistors $R_{21}$-$R_{23}$, and is interposed between the power terminals $P_1$ and $P_7$.

Though not restrictive, the output signal A from an ECL circuit (not shown) is applied to the terminal $P_4$ while the reference bias voltage $V_B$ is fed to the terminal $P_5$ from the bias portion $P_3$ via the terminal $P_6$ by the connection of the terminals $P_5$ and $P_6$ outside the IC as shown in the drawing.

Consequently, the abovementioned differential pair transistors $Q_{13}$ and $Q_{14}$ perform the differential operation in accordance with the ECL signal A supplied to the terminal $P_4$.

Namely, when the ECL signal A is at low level, the transistor $Q_{13}$ becomes conductive and the transistor $Q_{14}$, non-conductive. At this time a current flows from the resistor $R_{19}$ via the transistor $Q_{13}$ to the current source transistor $Q_{15}$. The potential $V_{N2}$ at the node $N_2$ is substantially at the ground potential (GND) e.g., $+0.3$ V, and the level of the potential at the node $N_2$ is at low level as the resistance of the resistor $R_{19}$ and the current value of the current flowing through the current source transistor $Q_{15}$ are suitably selected. On the other hand, as one $Q_{14}$ of the differential pair transistors $Q_{13}$ and $Q_{14}$ becomes non-conductive, the potential $V_{N1}$ at the node $N_1$ is substantially equal to the positive power source voltage $V_{CC}$ and the level of the potential at the node $N_1$ is at high level.

When the level of the potential at the node $N_2$ becomes low level, the Darlington-connected transistors $Q_{18}$ and $Q_{19}$ become non-conductive. When the level of the potential at the node $N_1$ becomes high level, the Darlington-connected transistors $Q_{16}$ and $Q_{17}$ become conductive. As a result, a high level signal having a voltage value approximate to $[V_{CC}-2\cdot V_{EE}]$ is generated at the output terminal $P_2$.

On the contrary, when the ECL signal A is at high level, the state of operation of the differential pair transistors $Q_{13}$ and $Q_{14}$ is reversed to the above. In other words, the potential $V_{N1}$ at the node $N_1$ is made substantially equal to the ground potential (GND) by suitably selecting in advance the resistance of the resistor $R_{20}$ and the current value of the current flowing through the current source transistor $Q_{15}$. At this time, since the level of the potential at the node $N_2$ is at high level, the Darlington-connected transistors $Q_{18}$ and $Q_{19}$ become conductive, while the Darlington-connected transistors $Q_{16}$ and $Q_{17}$ become non-conductive as the level of the potential at the node $N_1$ is at low level. In consequence, a low level signal substantially equal to the ground potential (GND) is produced at the output terminal $P_2$.

The abovementioned level conversion portion 1 drives the transistors $Q_{16}$, $Q_{17}$, $Q_{18}$ and $Q_{19}$ of the push-pull construction by means of the differential outputs at the nodes $N_1$ and $N_2$, thereby ensuring the high speed operation even if considerable stray capacitance (not shown) exists at each circuit point. Unlike the abovementioned circuit construction, there is a method which employs a phase split transistor such as one used in the heretofore known TTL circuit and derives signals of opposite phases to each other from the collector and emitter of the phase split transistor. In accordance with this method, however, the resistance values of the collector- and emitter-load resistors must be made relatively small in order to enable the high speed operation. For this reason, the power consumption increases especially at the time of the low level signal. In the level conversion portion 1 shown in FIG. 8, on the other hand, it is possible circuit-wise to eliminate such increase of the power consumption.

In the circuit of this embodiment (FIG. 8), the bias portion 2 is interposed electrically between the positive power source voltage $V_{CC}$ and the negative power source voltage $-V_{EE}$. The bias portion 2 comprises a voltage division circuit consisting of the resistors $R_7$ and $R_8$, the diodes $D_{11}$-$D_{13}$ and the resistor $R_9$, and an emitter follower circuit consisting of the transistor $Q_4$ and the resistor $R_{10}$. The bias portion 2 generates a bias voltage $V_{N4}$ for the protection transistor $Q_{12}$ and a bias voltage $V_{N5}$ for the transistor $Q_{10}$ that drives the current source transistor $Q_{15}$. Accordingly, even when the absolute value $|V_{EE}|$ of the negative power source voltage $-V_{EE}$ decreases below about 4 V, it never happens that the protection transistor $Q_{12}$ and the constant current transistor $Q_{15}$ are turned off. As represented by characteristics $l_{72}$ in FIG. 7, for example, even when the negative power source voltage $-V_{EE}$ approaches the ground potential (GND), both transistors $Q_{12}$ and $Q_{15}$ are never turned off. In consequence, the margin of a reduced voltage of the protection circuit with respect to the power source voltage $-V_{EE}$ can be expanded and circuit design can be markedly simplified.

Figure 7:
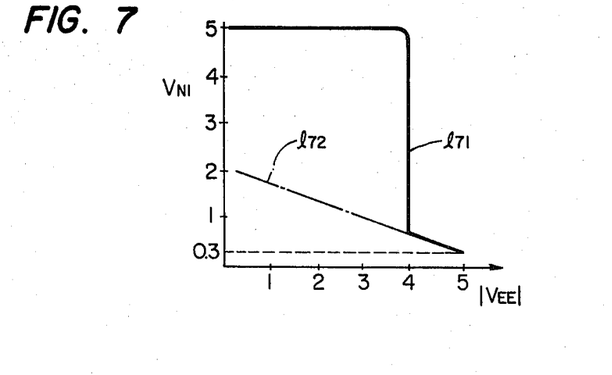
FIG. 7 is a characteristic curve of the circuit of FIGS. 1 and 8.

However, even when the protection transistor $Q_{12}$ and the differential transistor $Q_{14}$ are in the ON state, the output voltage $V_{N1}$ at the node $N_1$ rises as represented by the characteristic $l_{72}$ in FIG. 7 if the absolute value $|V_{EE}|$ of the power source voltage $-V_{EE}$ drops and approaches the ground potential (GND). If the power source voltage detection portion 5 is not connected at this time, the transistors $Q_{16}$ and $Q_{17}$ are sometimes turned on.

For, in the circuit shown in FIG. 8, when the absolute value $|V_{EE}|$ of the negative power source voltage $-V_{EE}$ becomes a small voltage value, a sufficient bias voltage is no longer fed to the transistor $Q_{10}$ of the bias portion 3 with the consequence that the emitter output current of the abovementioned transistor $Q_{10}$ decreases and the collector current of the current source transistor $Q_{15}$ of the level conversion portion 1 decreases in the corresponding manner.

Assume, for example, that one $Q_{13}$ of the differential pair transistors $Q_{13}$ and $Q_{14}$ of the level conversion portion 1 is in the ON state in response to the low level signal of the ECL level of the input A. In this case, the voltage drop through the resistor $R_{19}$ decreases to correspond to the decrease in the collector current of the current source transistor $Q_{15}$. As a result, the potential of the low level signal $V_{N2}$ at the node $N_2$ rises and the transistors $Q_{18}$ and $Q_{19}$ become conductive correspondingly. Hence, the potential level at the output terminal $P_2$ is caused to lower towards an undesirably low level.

On the contrary, if the other transistor $Q_{14}$ of the differential pair transistors $Q_{13}$ and $Q_{14}$ is brought into the ON state by the high level signal of the input A or if the protection transistor $Q_{12}$ is in the ON state due to the opening of the input terminals $P_4$ and $P_5$, the voltage drop through the resistor $R_{20}$ decreases in response to the decrease in the collector current of the current source transistor $Q_{15}$ with the consequence that the potential $V_{N1}$ of the low level signal at the node $N_1$ rises and the transistors $Q_{16}$ and $Q_{17}$ become conductive correspondingly. As a result, the level of the potential at the output terminal $P_2$ is caused to rise towards an undesirably high level.

Further, in the circuit of this embodiment (FIG. 8), if the positive power source voltage $V_{CC}$ rises beyond a predetermined normal range while the power source voltage detection portion 5 is not connected, the circuits such as the TTL circuit and the N-MOS circuit do not operate, or operate erroneously, at times. In other words, if the positive power source voltage $V_{CC}$ rises while deviating from the predetermined normal range, the potential level at both nodes $N_1$ and $N_2$ become high levels at times. This is because the value of the voltage drop at the resistor $R_{19}$ or $R_{20}$ is substantially set to a predetermined value that is determined by the constant current of the current source transistor $Q_{15}$. Namely, when the input signal to the input A is at low level, the low level signal potential $V_{N2}$ at the node $N_2$ increases with the increase of the power source voltage $V_{CC}$ for the abovementioned reason. As a result, the transistors $Q_{18}$ and $Q_{19}$, that should be in the OFF state, start becoming conductive along with the increase of the potential $V_{N2}$ at the node $N_2$. Hence, the potential level at the output terminal $P_2$ is caused to lower towards an undesirably low level.

On the other hand, the high level signal potential produced at the output terminal $P_2$ is determined in accordance with the positive power source voltage $V_{CC}$. If the positive power source voltage $V_{CC}$ drops from the predetermined normal range, the high level of the signal produced at the terminal $P_2$ can not be regarded as a definitely high level with respect to the TTL circuit and to the N-MOS circuit.

When the signal at the terminal $P_2$ is at an undesirable level due to the rise or fall of the positive power source voltage $V_{CC}$ as described above, the TTL circuit and the N-MOS circuit that receive the signal at the terminal $P_2$ do not operate or operate erroneously.

Further, in the embodiment of the invention (FIG. 8), if the power source voltage detection portion 5 is not connected, the level of the signals at the nodes $N_1$ and $N_2$ become simultaneously high level at times when the positive power source voltage $V_{CC}$ and the negative power source voltage $-V_{EE}$ are applied. In other words, the time required for a voltage to reach a normal value from making of the positive power source is different from that of the negative power source depending upon the circuit constructions of the two circuits receiving the positive and negative power source voltages, respectively. If making of the negative power source voltage is delayed substantially as compared with that of the positive power source voltage, the signal levels of the nodes $N_1$ and $N_2$ become high level substantially simultaneously within this delay time.

As described above, in the circuit of this embodiment (FIG. 8), if the power source detection portion 5 is not connected, the signal levels at the nodes $N_1$ and $N_2$ sometimes become high level substantially simultaneously owing to the difficiency of the negative power source voltage $V_{EE}$ or to the excess of the positive power source or in accordance with the sequence of the feed of the two power sources. In consequence, the signal level at the output terminal $P_2$ is changed undesirably and the push-pull output transistors $Q_{17}$ and $Q_{19}$ cascaded between the positive power terminal $P_1$ and the ground terminal $P_3$ are simultaneously turned on. When both output transistors $Q_{17}$ and $Q_{19}$ are simultaneously turned on, a penetrating current flows from the power source $V_{CC}$ to the output transistors $Q_{17}$ and $Q_{19}$, which penetrating current causes degradation or break-down of these transistors $Q_{17}$ and $Q_{19}$.

In order to prevent the degradation or break-down of the output transistors $Q_{17}$ and $Q_{19}$, it is theoretically possible to reduce the penetrating current by interposing a current limiting resistor between the cascade line of the output transistors $Q_{17}$ and $Q_{19}$. In accordance with this method, however, the output current at the output terminal $P_2$ is restricted by the current limiting resistor even when the circuit operates normally. Hence, when the capacitive load is connected to the output terminal $P_2$, for example, it is difficult to supply the capacitive load with signals that vary at a high speed.

In accordance with the embodiment of the invention (FIG. 8), however, it is possible to prevent the undesirable change of the output signal level at the output terminal $P_2$ as well as the occurrence of the penetrating current without using the current limiting resistor that would otherwise cause the abovementioned problem, by means of its power source voltage detection portion 5.

As shown in FIG. 8, this power source voltage detection portion 5 consists of resistors $R_{11}$-$R_{13}$ and transistors $Q_5$-$Q_8$. As the power source voltage detection portion 5 is connected as shown in the drawing, the transistors $Q_6$ and $Q_8$ are turned on when the value of the bias voltage $V_{N3}$ at the node $N_3$ of the aforementioned bias portion 2 becomes greater than the sum $2V_{BE}$ of the base-emitter voltages of the transistors $Q_6$ and $Q_8$ in the forward directon, and are turned off when the former is smaller than the latter.

As described above, the value of the bias voltage $V_{N3}$ at the node $N_3$ is smaller than $2V_{BE}$ when both positive and negative power source voltages are within suitable ranges, respectively. Under this state the transistor $Q_8$ is in the OFF state and does not perform any function to restrict the signals that appear at the node $N_1$ of the level conversion portion 1.

When the positive power source voltage $V_{CC}$ becomes excessively great or when the absolute value $|V_{EE}|$ of the negative power source voltage $-V_{EE}$ becomes excessively small, the bias voltage $V_{N3}$ at the node $N_3$ becomes greater than $2V_{BE}$, and the transistor $Q_8$ is turned on in response thereto.

The potential of the level at the node $N_1$ of the level conversion portion 1 is rendered substantially equal to the low level of the ground potential (GND) by the transistor $Q_8$ which is in the ON state as described above. As a result, the potential levels at the nodes $N_1$ and $N_2$ are prevented from becoming high levels simultaneously.

The present invention is not particularly restricted to the above-mentioned embodiment (FIG. 8), and the definite construction of the bias circuits for the protection transistor $Q_{12}$ and the current source transistor $Q_{15}$ may be modified variously. Other protection circuits such as the power source voltage detection circuit may also be optional.

The present invention can be widely used for the circuit which converts a signal of one polarity to a signal of the other polarity.

What is claimed is:

1. A level conversion circuit for deriving an output signal having a positive level from an input signal having a negative level comprising:
    first and second input transistors having the emitters thereof connected to one another;
    a first load resistor connected between the collector of said first input transistor and a positive power source voltage terminal;
    a second load resistor connected between the collector of said second input transistor and said positive power source voltage terminal;
    a current source transistor connected between the emitters of said first and second input transistors and a negative power source voltage terminal;
    an output circuit connected between said positive power source voltage terminal and a ground potential terminal, said output circuit being connected to receive signals from the collectors of said first and second input transistors and to produce said output signal;
    a bias circuit feeding a first bias voltage to the base of said current source transistor, said bias circuit being connected between said positive power source voltage terminal and said negative power source voltage terminal; and
    a third transistor receiving at the base thereof a second bias voltage generated by said bias circuit and having the collector and emitter thereof connected to the collector and emitter of said second input transistor, respectively.

2. The level conversion circuit as defined in claim 1, wherein said output circuit comprises a first emitter follower transistor having the base thereof connected to the collector of said first input transistor;
    a second emitter follower transistor having the base thereof connected to the collector of said second input transistor; and
    first and second output transistors cascaded between said positive power source voltage terminal and said ground potential terminal;
    the bases of said first and second output transistors connected to the emitters of said first and second emitter follower transistors, respectively.

3. The level conversion circuit as claimed in claim 2 which further includes:
    a first switching transistor having the collector thereof connected to the base of said second emitter follower transistor and the emitter thereof connected to the ground potential terminal;
    a fourth transistor receiving at the base thereof a third bias voltage generated by said bias circuit; and
    a third resistor connected between the collector of said fourth transistor and said positive power source voltage terminal;
    the collector output signal of said fourth transistor being impressed upon the base of said first switching transistor so that when said negative power source voltage drops, said fourth transistor is brought into the cut-off state before said current source transistor is cut off, thereby bringing said first switching transistor into the on state.

4. The level conversion circuit as defined in claim 3 which further includes:
    a second switching transistor having the collector thereof connected to the base of said first emitter follower transistor and the emitter thereof connected to the ground potential terminal;
    a fifth transistor having the emitter thereof connected to said bias circuit;
    a fourth resistor connected between the base of said fifth transistor and said positive power source voltage terminal; and
    means for transmitting the collector output signal of said fifth transistor to the base of said second switching transistor.

5. The level conversion circuit as defined in claim 2 which further includes an output terminal connected to the collector of said first output transistor and to the emitter of said second output transistor, wherein the output signal of said level conversion circuit is fed out from said output terminal and is impressed upon the input terminal of an N-MOS memory.

6. The level conversion circuit for deriving an output signal having a positive level from an input signal having a negative level comprising:
    first and second input transistors having the emitters thereof connected to one another;
    a first load resistor connected between the collector of said first input transistor and a positive power source voltage terminal;
    a second load resistor connected between the collector of said second input transistor and said positive power source voltage terminal;
    a current source transistor connected between the emitters of said first and second input transistors and a negative power source voltage terminal;
    an output circuit connected between said positive power source voltage terminal and a ground potential terminal, said output circuit being connected to receive signals from the collectors of said first and second input transistors and to produce said output signal;

a bias circuit feeding a first bias voltage to the base of said current source transistor, said bias current being connected between said positive power source voltage terminal and said negative power source voltage terminal, wherein said output circuit comprises first and second output transistors cascaded between said positive power source voltage terminal and said ground potential terminal, the collector output signal of said first input transistor being impressed upon the base of said first output transistor, and the collector output signal of said second input transistor being impressed upon the base of said second output transistor.

* * * * *